United States Patent [19]
Denda

[11] Patent Number: 4,920,284
[45] Date of Patent: Apr. 24, 1990

[54] CMOS LEVEL CONVERTER CIRCUIT WITH REDUCED POWER CONSUMPTION

[75] Inventor: Akira Denda, Tokyo, Japan
[73] Assignee: NEC Corporation, Tokyo, Japan
[21] Appl. No.: 261,634
[22] Filed: Oct. 24, 1988

[30] Foreign Application Priority Data
Oct. 22, 1987 [JP] Japan ................... 62-267794

[51] Int. Cl.$^5$ ............... H03K 19/092; H03L 5/00
[52] U.S. Cl. .................. 307/475; 307/296.3; 307/494; 307/264
[58] Field of Search ........... 307/475, 456, 455, 494, 307/495, 296.3, 264

[56] References Cited

U.S. PATENT DOCUMENTS

| | | | |
|---|---|---|---|
| 4,045,691 | 8/1977 | Asano | 307/475 |
| 4,150,308 | 4/1979 | Adlhock | 307/475 |
| 4,437,171 | 3/1984 | Hudson et al. | 307/475 |
| 4,532,436 | 7/1985 | Bismarck | 307/475 |
| 4,703,199 | 10/1987 | Ely | 307/475 |

Primary Examiner—Stanley D. Miller
Assistant Examiner—Richard Roseen
Attorney, Agent, or Firm—Burns, Doane, Swecker & Mathis

[57] ABSTRACT

In a semiconductor integrated circuit which contains, on the same chip, at least one logic circuit operating with a positive potential power and at least one logic circuit operating with a negative potential power, a level converter circuit is inserted between above logic circuits and is constituted of two series circuits each consisting of a P-channel MOSFET and an N-channel MOSFET connected in series between power lines supplied with the positive potential power and the negative potential power, and wirings to form a flip-flop circuit with each one MOSFET in respective series circuits.

10 Claims, 6 Drawing Sheets

FIG. 1
(PRIOR ART)

*FIG. 2*
ECL-TYPE CIRCUIT

*FIG. 3*
TTL-TYPE CIRCUIT

CMOS LEVEL CONVERTER CIRCUIT WITH REDUCED POWER CONSUMPTION

BACKGROUND OF THE INVENTION

1. Field of the Invention

The present invention relates to a level converter circuit employed in a semiconductor integrated circuit which utilizes both a positive potential source and a negative potential source.

2. Description of the Related Art

TTL logic circuits that have heretofore been used as logic circuits process logic signals having positive potential levels (i.e. TTL level signal). Such TTL logic circuits have features that the operating delay time is comparatively large, because the transistors employed in the TTL logic circuits are driven into saturated condition, but that the electric power consumption is small.

ECL logic circuits which are another type of widely used logic circuits process logic signals having negative potential levels (i.e. ECL level signal). The ECL logic circuits have such features that the operating delay time is small, because the transistors employed in the ECL logic circuits are driven only in unsaturated condition, but that the power consumption is relatively large, because a differential amplifier used in the ECL logic circuit allows a constant current flowing therethrough.

Generally, it is demanded in semiconductor logic integrated circuits that a circuit operates at a highspeed with a low power consumption and occupies a small area on a semiconductor chip. For resolving those demands, a combination of both TTL logic circuit and ECL logic circuit formed in the same chip has been conceived. In such case, the circuit must process not only the TTL level signal such as the ALS (Advanced Low-Power Schottky) TTL level signal with a positive potential source (+5.0 V) which is widely used for the conventional TTL logic circuits but also the ECL level signal such as ECL-10 KH, ECL-100 K level signal with the negative potential source (−4.5 V, −5.2 V, etc.) which is also used for the conventional ECL logic circuits Therefore, a level converter circuit converting between TTL and ECL levels is required that is interposed between a circuit, such as a TTL circuit, operating with the positive potential source and ground potential and a circuit, such as ECL circuit, constituted operating with the negative potential source and ground potential.

As the above-mentioned level converter circuit, a differential amplifier circuit was conventionally inserted between a TTL-type logic circuit operating with the positive potential source (Vcc) and the ground potential (GND) and the ECL-type logic circuit operating with the negative potential source ($V_{EE}$) and the ground potential. This level converter circuit operates with the positive potential source $V_{CC}$ and the negative potential source $V_{EE}$. The conventional level converter circuit having the differential amplifier circuit, however, consumed a large power in the operation mode, since the current steadily flowed through the differential amplifier.

Furthermore, the differential amplifier circuit necessitates, a reference voltage source and a constant current source which occupies a relatively large area on a semiconductor chip. Therefore, it has been difficult to fabricate the above integrated circuit including the differential amplifier type level converter at a high integration scale.

SUMMARY OF THE INVENTION

A primary object of the present invention is to provide a level converter circuit which can operate at a high speed with a small electric power consumption, and can be fabricated at a large integration scale.

The level converter circuit according to the present invention comprises a first MOS transistor of one conductivity type connected between a first power line held at a first potential of a first polarity and a first node and having a gate receiving a first signal having a potential swing between the first potential and a ground potential, a second MOS transistor of the one conductivity type connected between the first power line and a second node and having a gate receiving a second signal having an opposite phase to the first signal, a third MOS transistor of the other conductivity type connected between the first node and a second power line held at a second polarity of an opposite polarity to the first polarity and having a gate connected to the second node, a fourth MOS transistor of the other conductivity type connected between the second power line and the second node and having a gate coupled to the first node, wherein a third signal which is obtained by converting the first signal is produced at the second node.

According to the present invention, a signal having an amplitude between the first potential of one polarity and the ground potential is converted into a signal having an amplitude between the first potential and the second potential of the opposite polarity, or an amplitude between the second potential and the ground potential.

In the above-mentioned level converter circuit of the present invention, a current flows through the MOS transistors in the converter circuit only at the transient condition in which the logic state undergoes its change, and thus the power consumption is saved to be very small. Therefore, the consumption of electric power decreases greatly, as compared with the above-mentioned prior art converter.

Furthermore, the number of circuit elements required in the converter circuit decreases greatly to improve the integration scale, because the present converter circuit does not have a differential amplifier circuit and necessitates neither a reference voltage source nor a constant current source.

BRIEF DESCRIPTION OF THE DRAWINGS

The above and further objects, features and advantages of the present invention will become more apparent from the following detailed description with reference to the accompanying drawings, wherein.

DESCRIPTION OF THE PRIOR ART

Figure 1:
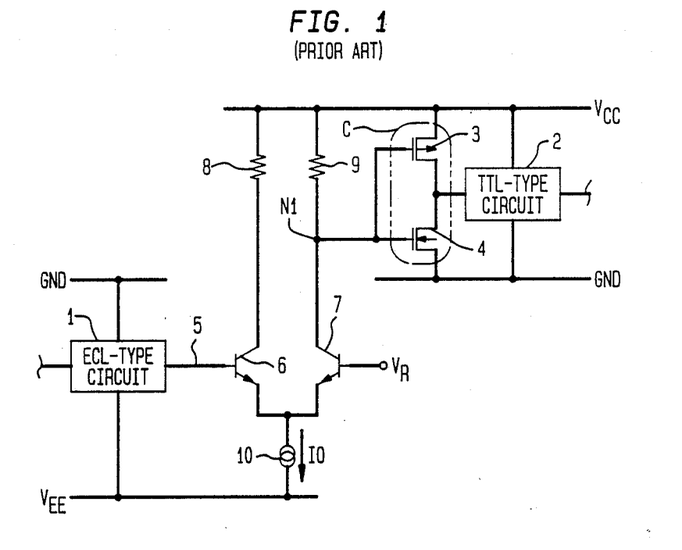
FIG. 1 is a circuit diagram showing a conventional level converter circuit.

Referring to FIG. 1 of the drawings, a known conventional level converter using a differential amplifier circuit is shown in association with logic circuits. As the logic circuits, an ECL circuit 1 operating with a negative potential $V_{EE}$ and a ground potential GND and a TTL circuit 2 operating with a positive potential $V_{CC}$ and the ground potential GND, are employed. The differential amplifier circuit as a level converter circuit is inserted between these logic circuits 1 and 2. This differential amplifier circuit is connected between the positive potential power line ($V_{CC}$) and the negative potential power line ($V_{EE}$). More specifically, a first series circuit of a load resistor 8 and a bipolar transistor 6, and a second series circuit of a load resistor 9 and a bipolar transistor 7 are connected in parallel between the positive potential power line ($V_{CC}$) and a constant current source 10. The emitters of the bipolar transistors 6 and 7 are connected each other to be connected with the negative potential power line ($V_{EE}$) via the constant current source 10. An output terminal 5 of the ECL-type circuit 1 is connected to the base of the bipolar transistor 6. A reference voltage $V_R$ is input to the base of the bipolar transistor 7. A connecting node N1 between the load resistor 9 and the bipolar transistor 7 may be directly connected to an input of TTL-type circuit 2 or may be connected to the input of the TTL-type circuit 2 via a CMOS inverter C constituted of a series connection of a P channel MOSFET 3 and an N-channel MOSFET 4 connected between the positive potential power line ($V_{CC}$) and ground potential line (GND). The CMOS inverter C is inserted as an input buffer for waveshaping to obtain the TTL level signal.

Figure 2:
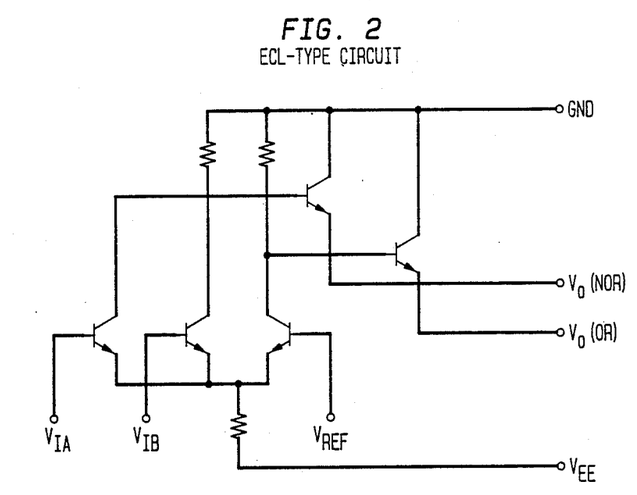
FIG. 2 is a circuit diagram showing the circuit of a typical example of the ECL type logical circuit.
Figure 3:
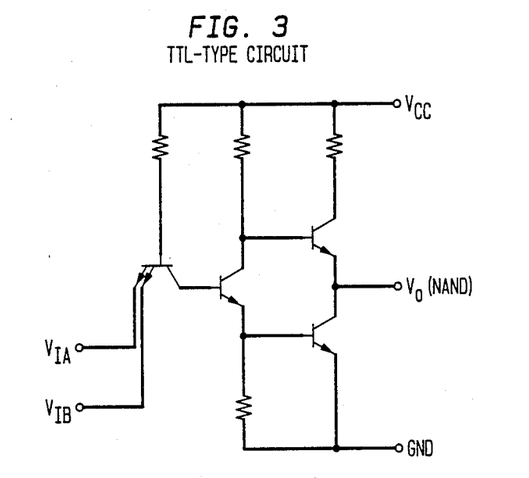
FIG. 3 is a circuit diagram showing the circuit of a typical example of the TTL type logical circuit.

Typical circuits of the ECL-type circuit 1 and TTL-type circuit 2 used in FIG. 1 will now be described with reference to FIGS. 2 and 3. Generally, the ECL-type circuit is driven with a power source obtained between the negative potential power line ($V_{EE}$) and the ground potential line (GND), a typical value of the negative potential $V_{EE}$ being of $-5.2$ V and logic of amplitude of the ECL level signal is about 0.8 V having a high level of $-0.9$ V and a low level of $-1.7$ V. Furthermore, the TTL-type circuit is driven with a power source obtained between the positive potential power line ($V_{CC}$) and the ground potential line (GND), a typical value of the positive potential $V_{CC}$ being of $+0.5$ V and the logic of amplitude being about 2.0 V having a high level of 2.5 V and a low level of 0.5 V. These TTL-type and ECL-type circuits as shown in FIGS. 2 and 3 are well known ones. Therefore, it would be needless to explain furthermore about these circuits.

Operation of the prior art level converter circuit shown in FIG. 1 will now be described.

When an output signal at the terminal 5 of the ECL-type circuit 1 assumes a high level "H" ($>V_R$), the bipolar transistor 6 is rendered conductive while the bipolar transistor 7 is rendered nonconductive. Therefore, the steady-state current $I_O$ of several tens mA flows through the bipolar transistor 6. As a result, the "H" level ($=V_{CC}$) potential is produced at the node N1 and hence a low ("L") level ($=$GND) signal which is generated from the CMOS inverter C is input to the TTL-type circuit 2.

Next, when the output signal at the terminal 5 of the ECL-type circuit 1 assumes the level "L" ($<V_R$), the bipolar transistor 6 is rendered nonconductive while the bipolar transistor 7 is rendered conductive. Therefore, the steady-state current $I_O$ flows through the bipolar transistor 7 and hence the "L" level ($=V_{EE}$) potential is produced at the node N1. Hence, the CMOS inverter C generates "H" level ($=V_{CC}$) signal which is applied to the TTL-type circuit 2.

Thus, a signal having an amplitude between the negative potential $V_{EE}$ and ground potential GND is first converted into a signal having an amplitude between the negative potential $V_{EE}$ and the positive potential $V_{CC}$, and furthermore converted into a signal having an amplitude between the positive potential $V_{CC}$ and ground potential GND. According to this prior level converter, however, the consumption of electric power was very large since the current $I_O$ constantly flows between the positive potential power line ($V_{CC}$) and the negative potential power line ($V_{EE}$).

Furthermore, there were required the constant current source 10 for providing a constant current $I_O$ to the transistors 6 and 7 and the reference voltage generating circuit for providing the reference voltage $V_R$ to the base of the bipolar transistor 7. These circuits occupy a relatively large area on a semiconductor chip, resulting in a low-integration density.

DETAILED DESCRIPTION OF THE PREFERRED EMBODIMENTS

The invention will now be described with reference to the drawings.

Figure 4:
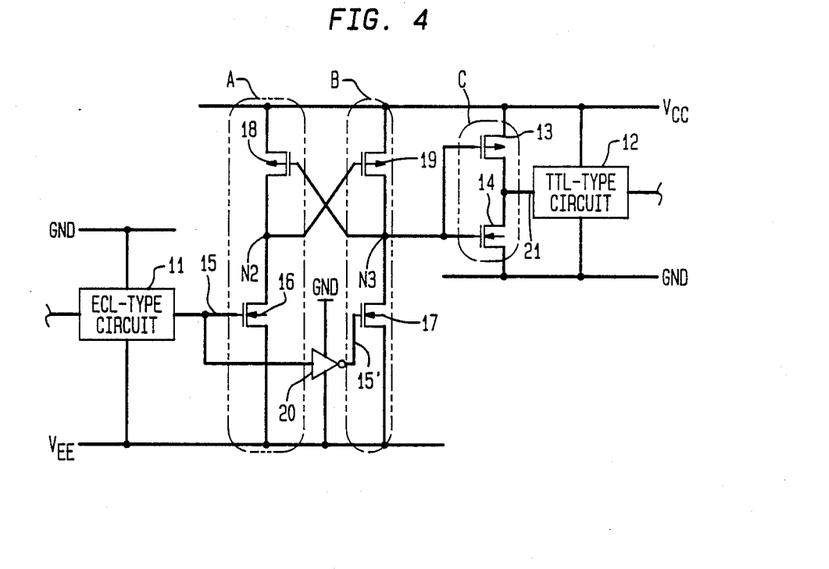
FIG. 4 is a circuit diagram showing the level converter circuit according to a first preferred embodiment of the present invention.

Referring to FIG. 4, an integrated circuit using the level converter circuit according to a first embodiment of the present invention will be explained. The integrated circuit has both an ECL-type circuit and a TTL-type circuit formed in the same chip. The level converter circuit of the present invention comprises a first series circuit A having a P-channel MOSFET 18 and an N-channel MOSFET 16 connected in series and a second series circuit B having a P-channel MOSFET 19 and an N-channel MOSFET 17 connected in series as shown in FIG. 4. Both of the first series circuit A and the second series circuit B are connected in parallel between a positive potential power line ($V_{CC}$) and a negative potential power line ($V_{EE}$).

The gate of the P-channel MOSFET 18 of the first series circuit A is connected to a node N3 of the second series circuit B, and the gate of the P-channel MOSFET 19 of the second series circuit B is connected to a node N2 of the first series circuit A. The signal level at the node N3 is applied to a TTL-type circuit 12 through a CMOS inverter circuit C composed of a P-channel MOSFET 13 and an N-channel MOSFET 14 connected in series between the positive potential power line ($V_{CC}$) and the ground potential line (GND).

Further, an output signal 15 of the ECL-type circuit 11 is applied to the gate of the N-channel MOSFET 16 of the first series circuit A, which another signal 15' having a phase opposite to that of the signal 15 is applied to the gate of the N-channel MOSFET 17 of the second series circuit B via an inverter 20.

Figure 5:
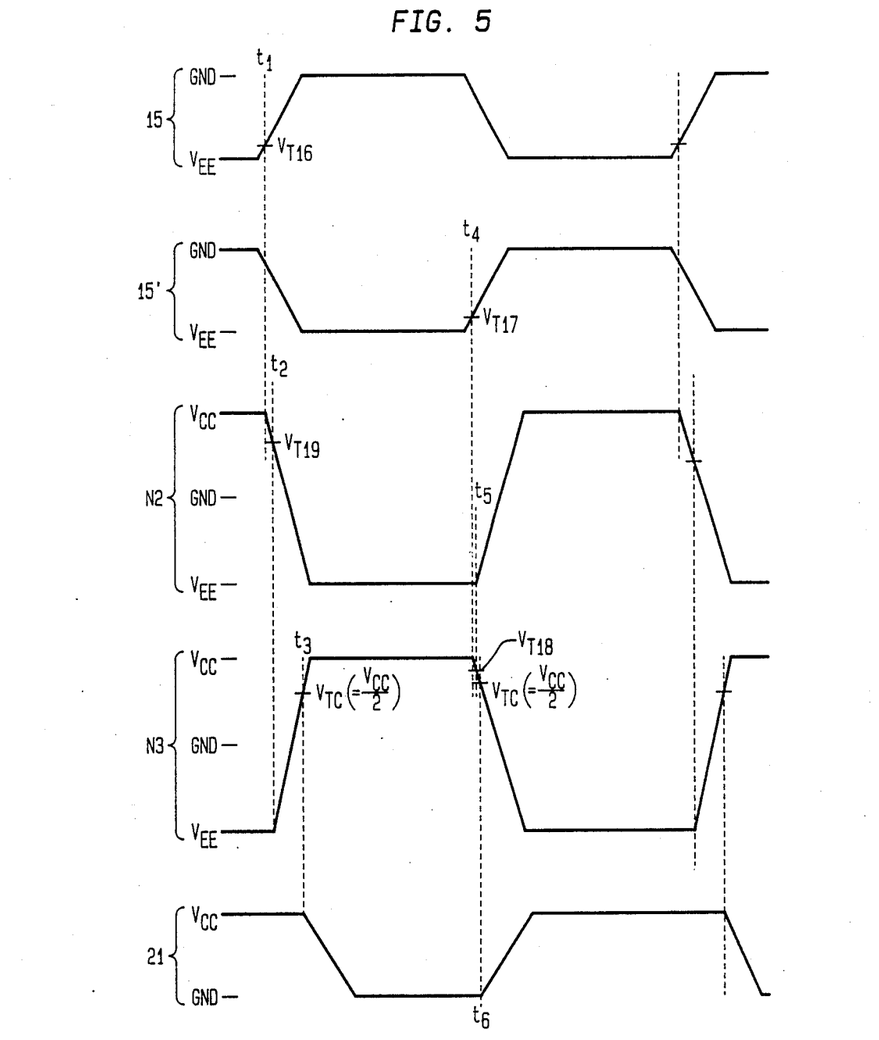
FIG. 5 is a timing chart showing examples of the waveforms at various circuit points in the level converter circuit shown in FIG. 4.

Operation of the level converter circuit thus constructed and arranged will now be described with reference to FIG. 5.

In a process that the output signal 15 of the ECL circuit 11 changes from the "L" (=$V_{EE}$) level to the "H" (=GND) level, after the signal level of the signal 15 exceeds a threshold voltage $V_{T16}$ of the N-channel MOSFET 16 at a timing $t_1$, the N-channel MOSFET 16 is rendered conductive state. At this time, the N-channel MOSFET 17 is rendered nonconductive state since the signal 15' falls below a threshold voltage $V_{T17}$ of the N-channel MOSFET 17. Therefore, the negative potential $V_{EE}$ is generated at the node N2 of the first series circuit A, so that the signal at the node N2 is changed to the "L" (=$V_{EE}$) level.

At a timing $t_2$ when the level at node N2 falls below a threshold voltage $V_{T19}$ of the P-channel MOSFET 19, the P-channel MOSFET 19 is rendered conductive state, while signal level at the node N3 of the second series circuit B is changed to the "H" (=$V_{CC}$) level since the positive potential $V_{CC}$ is generated at the node N3. Therefore, the P-channel MOSFET 18 is rendered nonconductive state so that the node N3 assumes the "H" (=$V_{CC}$) level and the node N2 assumes the "L" (=$V_{EE}$) level and the steady-state is introduced. The "H" level of the signal at the node N3 is applied to the CMOS inverter circuit C. At a timing $t_3$ when the node N3 level reaches a threshold voltage $V_{TC}$ (=$V_{CC}/2$) of the CMOS inverter circuit C, an output signal 21 of the CMOS inverter circuit C is changed to the "L" (=GND), and the "H" level of the signal 21 is applied to the TTL-type circuit 12.

Next, through a course that the output signal 15 level of the ECL circuit 11 changes from "H" (=GND) to "L" (=$V_{EE}$), when the level of the signal 15' exceeds a threshold voltage $V_{T17}$ of the N-channel MOSFET 17 at a timing $t_4$, the N-channel MOSFET 17 is rendered conductive state. At this time, the N-channel MOSFET 16 is rendered nonconductive state, since the signal 15 falls below the threshold voltage $V_{T16}$ of the N-channel MOSFET 16. Therefore, the negative potential $V_{EE}$ is produced at the node N3 of the second series circuit B, so that the signal level at the node N3 is changed to "L" (=$V_{EE}$) At a timing $t_5$ when the level of the node N3 falls below the threshold voltage $V_{T18}$ of the P-channel MOSFET 18, the P-channel MOSFET 18 is rendered conductive state, and the signal level at the node N2 of the first series circuit A is changed to "H" (=$V_{CC}$) since the positive potential $V_{CC}$ is produced at the node N2. Therefore, the P-channel MOSFET 19 is rendered nonconductive state so that the node N2 assumes "H" (=$V_{CC}$) and the node N3 assumes "L" (=$V_{EE}$). Thus, the steady-state is established. In this instance, the "L" level of the node N3 is applied to the CMOS inverter circuit C. At a timing $t_6$ when the signal level at the node N3 falls below the threshold voltage $V_{TC}$ (=$V_{CC}/2$) of the CMOS inverter circuit C, the output signal 21 of the CMOS inverter circuit C is changed to "H" (=$V_{CC}$), and the signal 21 of "H" level is input to the TTL-type circuit 12.

Therefore, a signal having an amplitude between the negative potential $V_{EE}$ and the ground potential GND is converted into a signal having an amplitude between the negative potential $V_{EE}$ and the positive potential $V_{CC}$ which is produced at the nodes N2 and N3. Furthermore, if the signal at the node N3 is input to the CMOS inverter circuit C connected between the positive potential power line ($V_{CC}$) and ground potential line (GND) in the subsequent stage as shown in FIG. 4, there is obtained a signal having an amplitude between the positive potential $V_{CC}$ and ground potential GND therefrom.

In this case, through this converter circuit system allows a current flow only in the transient period in which the logic undergoes the change, and the consumption of electric power decreases greatly compared with the case of conventional art shown in FIG. 1.

Furthermore, the number of circuit elements decreases greatly, because the converter circuit does not use a differential amplifier circuit and then does not need a reference voltage source and a constant current source.

In the level converter circuit as shown in FIG. 4, under the steady-state that signal levels at the nodes N2 and N3 are fixed, one MOSFET in each series circuit is non-conductive and, therefore, the potential difference between the positive potential $V_{CC}$ and the negative potential $V_{EE}$ is impressed across the sources and drains of respective non-conductive MOS FETs in the first and second series circuits A and B of the converter circuit. Therefore, the non-conductive MOS FETs extend a depletion layer from their drain regions. This depletion layer may reach their source, causing a punch-through phenomena between the source and drain of the non-conductive FET. As a result, a large feedthrough current flows through a current path caused by the punch-through between the source and drain so that the signal levels at the node N2 and N3 fluctuate and become uncontrollable. As a measure of this trouble, each MOSFET 16, 17, 18, 19 in FIG. 4 can be replaced by two or more MOSFETs connected in series as shown in FIG. 6.

Figure 6:
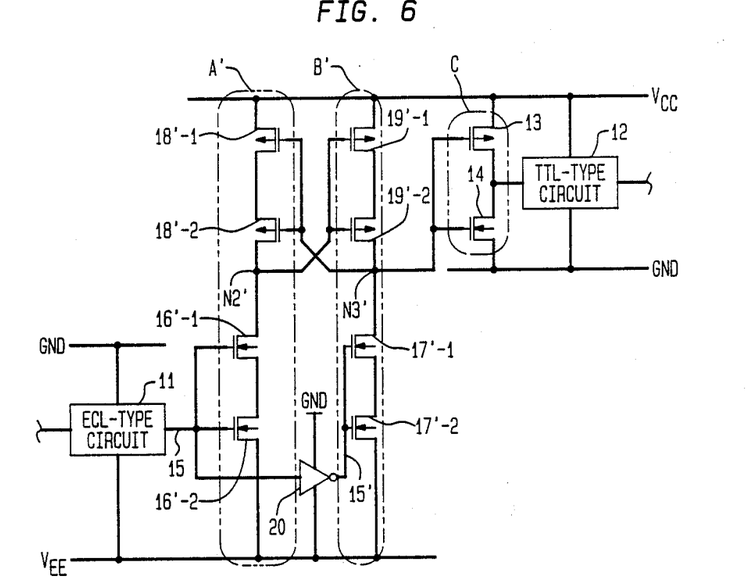
FIG. 6 is a circuit diagram showing the level converter circuit according to a second embodiment of the present invention.

Namely, the level converter circuit includes a series circuit A' having P-channel MOSFETs 18'-1 and and 18'-2 and N-channel MOSFETs 16'-1 and 16'-2 connected in series and a second series circuit B' having P-channel MOSFETs 19'-1 and 19'-2 and N-channel MOSFETs 17'-1 and 17'-2 connected in series as shown in FIG. 6. Both of the first series circuit A' and the second series circuit B' are connected in parallel between the positive potential power line ($V_{CC}$) and the negative potential line ($V_{CC}$).

The gates of the P-channel MOSFETs 18'-1 and 18'-2 of the first series circuit A' are connected to the node N3' of the second series circuit B', and the gates of the P-channel MOSFETs 19'-1 and 19'-2 of the second series circuit B' are connected to the node N2' of the first series circuit A'. The signal level at the node N3' is applied directly to the TTL-type circuit 12 or the TTL-type circuit 12 via the CMOS inverter circuit C connected between the positive potential power line ($V_{CC}$) and the ground potential line (GND).

Further, an output signal 15 of the ECL-type circuit 11 connected between the negative potential power line ($V_{EE}$) and ground potential line (GND) is applied to the gates of the N-channel MOSFETs 16'-1 and 16'-2 of the first series circuit A', and the signal 15' having a phase opposite to that of the signal 15 is applied to the gates of the N-channel MOSFETs 17'-1 and 17'-2 of the second series circuit B' via the inverter 20.

According to this arrangement, the voltage applicable to each non-conductive MOSFET is decreased since the voltage impressed across the source and drain of each non-conductive MOSFET e.g. 18 in FIG. 4 is devided by the two non-conductive MOSFETs e.g. 18'-1 and 18'-2 connected in series. Therefore, the current-path caused by the punch-through between the source and drain is effectively prevented so that the signal levels at the nodes N2' and N3' are secured.

Figure 7:
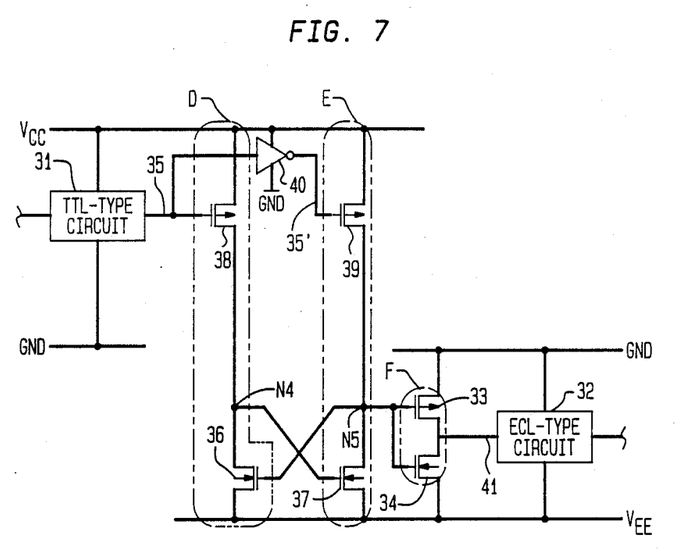
FIG. 7 is a circuit diagram showing the level converter according to a third embodiment of the present invention.

With reference to FIG. 7, the level converter circuit according to a third embodiment of the present invention will be explained. The level converter circuit of the present embodiment includes a first series circuit D having a P-channel MOSFET 38 and an N-channel MOSFET 36 connected in series and a second series circuit E having a P-channel MOSFET 39 and an N-channel MOSFET 37 connected in series as shown in FIG. 7. Both of the first series circuit D and the second series circuit E are connected in parallel between the positive potential power line ($V_{CC}$) and the negative potential line ($V_{EE}$).

The gate of a N-channel MOSFET 36 of the first series circuit D is connected to a node N5 of the second series circuit E, and the gate of an N-channel MOSFET 37 of the second series circuit E is connected to a node N4 of the first series circuit D. The signal level at the node N5 is applied to an ECL-type circuit 32 via a CMOS inverter circuit F having a P-channel MOSFET 33 and an N-channel MOSFET 34 connected in series between the negative potential power line ($V_{EE}$) and the ground potential line (GND).

Further, an output signal 35 of the TTL-type circuit 31 connected between the positive potential power line ($V_{CC}$) and the ground potential line (GND) is input to the gate of the P-channel MOSFET 38 of the first series circuit D, and a signal 35' having a phase opposite to that of the signal 35 is applied to the gate of the P-channel MOSFET 39 of the second series circuit E via an inverter 40.

Next, operation of this level converter circuit will be described.

When, for example, the output signal 35 of the TTL-type circuit 31 has the level "L" (GND), the level "L" is provided to the gate of the P-channel MOSFET 38 and the P-channel MOSFET 38 is rendered conductive, the P-channel MOSFET 39 is rendered nonconductive since the level "H" of the signal 35' is applied to the gate thereof via an inverter 40, whereby the node N4 of the first series circuit D assumes the level "H" ($V_{CC}$). This causes the N-channel MOSFET 37 to be rendered conductive, and whereby the node N5 of the second series circuit E assumes the level "L" ($V_{EE}$). Therefore, the N-channel MOSFET 36 is rendered nonconductive; i.e., the node N5 assumes the level "L" ($V_{EE}$) and the node N4 assumes the level "H" ($V_{CC}$) which represents the steady-state. The "L" level at the node N5 is applied to the CMOS inverter circuit F, and hence the output signal 41 thereof assumes the level "H" (GND) which is input to the ECL-type circuit 32.

Next, when the output signal 35 of the TTL-type circuit 31 assumes the level "H" ($V_{CC}$), the P-channel MOSFET 38 is rendered nonconductive, the P-channel MOSFET 39 is rendered conductive since the level "L" of the signal 35' is applied to the gate thereof while, the node N5 of the second series circuit E assumes "H" ($V_{CC}$), the N-channel MOSFET 36 is rendered conductive, and the node N4 of the first series circuit assumes "L" ($V_{EE}$). Therefore, the N-channel MOSFET 37 is rendered nonconductive so that the node N4 assumes "L" ($V_{EE}$) and the node N5 assumes "H" ($V_{CC}$) which represents the steady-state operation.

The level "H" of the signal at the node N5 is applied to the CMOS inverter circuit F, and its output signal 41 assumes the level "L" ($V_{EE}$) which is input to the ECL-type circuit 32.

Therefore, a signal having an amplitude between the positive potential $V_{CC}$ and ground potential GND is converted into a signal having an amplitude between the positive potential $V_{CC}$ and the negative potential $V_{EE}$. Furthermore, a signal having an amplitude between the negative potential $V_{EE}$ and ground potential GND can be obtained in the same manner as in the first embodiment the signal level at the node N5, is received by the CMOS inverter circuit connected between the negative potential $V_{EE}$ and ground potential GND in the subsequent stage.

According to the present invention, in the circuit operating with two kinds of power voltage, i.e., positive power voltage and negative power voltage and formed in the same chip, a signal having an amplitude between the negative potential and the ground potential is converted into a signal having amplitude between the positive potential and the negative potential or having an amplitude between the positive potential and the ground potential or vice versa, with a reduced amount of electric power consumption and the reduced number of circuit elements.

What is claimed is:

1. A level converter circuit comprising: a first MOS transistor of one conductivity type connected between a first potential power line receiving a first potential of a first polarity and a first node and having a gate receiving a first signal having an amplitude between said first potential and a ground potential, a second MOS transistor of said one conductivity type connected between said first potential power line and a second node and having a gate receiving a second signal having an opposite phase to said first signal, a third MOS transistor of an opposite conductivity type connected between said first node and a second potential power line receiving a second potential of a second polarity opposite to said first polarity and having a gate coupled to said second node, a fourth MOS transistor of said opposite conductivity type connected between said second potential power line and said second node and having a gate coupled to said first node, a fifth MOS transistor of said opposite conductivity type connected between said second potential power line and a third node and having a gate coupled to said second node, and a sixth MOS transistor of said one conductivity type connected between a ground potential line receiving said ground potential and said third node and having a gate coupled to said second node, wherein a third signal obtained by converting said first signal and having an amplitude between said second potential and said ground potential is generated from said third node.

2. A level converter circuit as defined in claim 1, wherein said first and second polarities are a negative polarity and a positive polarity, respectively, and said first, second and sixth MOS transistors are N-channel type MOS transistors while said third, fourth and fifth MOS transistors are P-channel type MOS transistors.

3. A level converter circuit as defined in claim 1, wherein said first and second polarities are a positive polarity and a negative polarity, respectively, and said first, second and sixth MOS transistors are P-channel type MOS transistors while said third, fourth and fifth MOS transistors are N-channel type MOS transistors.

4. A level converter circuit comprising: a first MOS transistor of one conductivity type connected between a first potential power line receiving a first potential of a first polarity and a first node and having a gate receiving a first signal having an amplitude between said first potential and a ground potential, a second MOS transistor of said one conductivity type connected between said first potential power line and a second node and having a gate receiving a second signal having an opposite phase to said first signal, a third MOS transistor of an opposite conductivity type connected between said first node and a second potential power line receiving a second potential of a second polarity opposite to said first polarity and having a gate coupled to said second node, and a fourth MOS transistor of said opposite conductivity type connected between said second potential power line and said second node and having a gate coupled to said first node, wherein a third signal obtained by converting said first signal is generated from said second node, and wherein each of said first and second MOS transistors is a series circuit of a plurality of MOS transistors of said one conductivity type operating as a single equivalent MOS transistor, and each of said third and fourth MOS transistors is a series circuit of a plurality of MOS transistors of said opposite conductivity type operating as a single equivalent transistor.

5. A level converter circuit comprising: a first logic circuit connected between a first potential power line receiving a first potential of a first plurality and a ground potential line, a first MOS transistor of one conductivity type connected between said first potential power line and a first node and having a gate receiving an output signal of said first logic circuit, an inverter circuit inverting a phase of said output signal of said first logic circuit, a second MOS transistor of said one conductivity type connected between said first potential power line and a second node and having a gate receiving an output signal of said inverter circuit, a third MOS transistor of an opposite conductivity type connected between said first node and a second potential power line receiving a second potential of a second polarity opposite to said first polarity and having a gate coupled to said second node, a fourth MOS transistor of said opposite conductivity type connected between said second potential power line and said second node and having a gate coupled to said first node, a fifth MOS transistor of said opposite conductivity type connected between said second potential power line and a third node and having a gate coupled to said second node, a sixth MOS transistor of said one conductivity type connected between said ground potential line and said third node and having a gate coupled to said second node, and a second logic circuit connected between said second potential power line and said ground potential line and receiving a signal at said third node.

6. A level converter circuit as defined in claim 5, wherein said first logic circuit is an ECL-type circuit, said second logic circuit is a TTL-type circuit, said first and second polarities are negative and positive polarities, respectively, said first, second and sixth MOS transistors are N-channel type MOS transistors, and said third, fourth and fifth MOS transistors are P-channel type MOS transistors.

7. A level converter circuit as defined in claim 5, wherein said first logic circuit is a TTL-type circuit, said second logic circuit is an ECL-type circuit, said first and second polarities are positive and negative polarities, respectively, said first, second and sixth MOS transistors are P-channel type MOS transistors, and said third, fourth and fifth MOS transistors are N-channel type MOS transistors.

8. A level converter circuit comprising: a first series circuit of plural number of MOS transistors of one conductivity type having gates connected in common to receive a first signal having a potential level swing between a first potential in a first polarity and a ground potential, said first series circuit being connected between a first power line held at said first potential and a first node, a second series circuit of plural number of MOS transistors of one conductivity type having gates connected in common to receive a second signal having a phase opposite to said first signal, said second series circuit being connected between said first power line and a second node, a third series circuit of plural number of MOS transistors of opposite conductivity type having gates connected in common to said second node, said third series circuit being connected between said first node and a second power line held at said second potential opposite to said first polarity, and a fourth series circuit of plural number of MOS transistors of said opposite conductivity type having gates connected in common to said first node, said fourth series circuit being connected between said second power line and said second node, whereby said second node produces a third signal obtained by converting said first signal.

9. A level converter circuit as defined in claim 8, wherein said first polarity is negative polarity, said second polarity is positive polarity, said first and second series circuits are respectively made of N-channel type MOS transistors, and said third and fourth series circuits are respectively made of P-channel type MOS transistors.

10. A level converter circuit as defined in claim 8, wherein said first polarity is positive polarity, said second polarity is negative polarity, said first and second series circuits are respectively made of P-channel type MOS transistors, and said third and fourth series circuits are respectively made of N-channel type MOS transistors.

* * * * *